US012740141B2

(12) United States Patent
Bienvenu et al.

(10) Patent No.: US 12,740,141 B2
(45) Date of Patent: Sep. 15, 2026

(54) H-BRIDGE COMMAND CIRCUIT

(71) Applicant: STMicroelectronics International N.V., Geneva (CH)

(72) Inventors: Philippe Bienvenu, Saint-Maximin la Sainte Baume (FR); Julia Castellan, Trets (FR); Antonio Calandra, Saint-Maximin la Sainte Baume (FR)

(73) Assignee: STMicroeletronics N.V., Geneva (CH)

( * ) Notice: Subject to any disclaimer, the term of this patent is extended or adjusted under 35 U.S.C. 154(b) by 296 days.

(21) Appl. No.: 18/524,915

(22) Filed: Nov. 30, 2023

(65) Prior Publication Data

US 2024/0194679 A1 Jun. 13, 2024

(30) Foreign Application Priority Data

Dec. 13, 2022 (FR) ...................................... 2213283

(51) Int. Cl.

| | |
|---|---|
| ***H10D 84/85*** | (2025.01) |
| ***H02P 7/03*** | (2016.01) |
| ***H10D 30/65*** | (2025.01) |
| ***H10D 30/66*** | (2025.01) |
| ***H10D 64/00*** | (2025.01) |
| ***H10D 64/23*** | (2025.01) |

(52) U.S. Cl.

CPC ............. *H10D 84/856* (2025.01); *H02P 7/04* (2016.02); *H10D 30/65* (2025.01); *H10D 30/668* (2025.01); *H10D 64/117* (2025.01); *H10D 64/252* (2025.01); *H10D 64/257* (2025.01)

(58) Field of Classification Search

CPC ............. H10D 84/8312; H10D 64/252; H10D 84/856; H10D 84/835; H10D 64/257; H10D 84/016; H10D 84/013; H10D 30/668; H10D 30/65; H10D 84/038; H10D 64/117; H10D 84/839; H02P 7/04

USPC .............................................................. 257/7

See application file for complete search history.

(56) References Cited

U.S. PATENT DOCUMENTS

| | | | | |
|---|---|---|---|---|
| 5,703,390 | A | 12/1997 | Itoh | |
| 7,864,594 | B2 * | 1/2011 | Tsai | G11C 16/10 365/72 |
| 8,193,559 | B2 * | 6/2012 | Haeberlen | H10D 84/0149 257/773 |
| 2004/0041549 | A1 | 3/2004 | Halfman et al. | |
| 2004/0061163 | A1 | 4/2004 | Nakayama | |
| 2004/0080982 | A1 * | 4/2004 | Roizin | H10B 41/30 257/E21.422 |
| 2005/0133860 | A1 * | 6/2005 | Forbes | H10B 69/00 438/290 |

(Continued)

FOREIGN PATENT DOCUMENTS

| | | |
|---|---|---|
| JP | H0258372 A | 2/1990 |

*Primary Examiner* — Gabriel Agared

(74) *Attorney, Agent, or Firm* — Slater Matsil, LLP

(57) ABSTRACT

An integrated monolithic H-bridge is formed in a bulk semiconductor region. A first branch includes a first vertical MOS transistor and a second lateral MOS transistor integrated in the bulk semiconductor region. The first vertical MOS transistor and the second lateral MOS transistor are coupled in series. A second branch includes a third vertical MOS transistor and a fourth lateral MOS transistor integrated in the bulk semiconductor region. The third vertical MOS transistor and the fourth lateral MOS transistor are coupled in series and the first and second branches being coupled in parallel.

20 Claims, 4 Drawing Sheets

(56) References Cited

U.S. PATENT DOCUMENTS

| | | | | |
|---|---|---|---|---|
| 2007/0070707 | A1* | 3/2007 | Yamamoto | H10B 41/60<br>365/185.23 |
| 2010/0061171 | A1* | 3/2010 | Kim | G11C 11/413<br>365/210.1 |
| 2013/0140673 | A1 | 6/2013 | Haeberlen et al. | |
| 2019/0164981 | A1* | 5/2019 | Chen | G11C 11/5621 |
| 2022/0319598 | A1* | 10/2022 | Bregoli | G11C 16/14 |

* cited by examiner

H-BRIDGE COMMAND CIRCUIT

CROSS-REFERENCE TO RELATED APPLICATIONS

This application claims the priority benefit of French patent application number FR2213283, filed on Dec. 13, 2022, which is hereby incorporated by reference to the maximum extent allowable by law.

TECHNICAL FIELD

The present disclosure generally concerns electronic circuits and, in specific embodiments, H-bridges command circuits.

BACKGROUND

The H-bridges of switches are currently used in electronic circuits to power and control loads such as, for example, motors, for example, in the automobile field.

SUMMARY

Embodiments provide monolithically integrated H-bridge command circuits having an optimized efficiency and provide improvements over known H-bridges.

An embodiment provides an integrated monolithic H-bridge comprising, inside and on top of a same bulk a first branch comprising a first vertical MOS transistor and a second lateral MOS transistor in series and a second branch comprising a third vertical MOS transistor and a fourth lateral MOS transistor in series. The first and second branches are associated in parallel.

According to an embodiment, the midpoints of the first and second branches define output terminals of the H-bridge.

According to an embodiment, the source of the first transistor is coupled to the midpoint between the transistors in series of the first branch and the source of the third transistor is coupled to the midpoint between the transistors in series of the second branch.

According to an embodiment, the drains of the first and third transistors are common on the back side of the bulk.

According to an embodiment, the first and third transistors form the transistors on the high side of the bridge, their drains being intended to be applied the highest potential of a DC voltage applied to the bridge.

According to an embodiment, the gates and sources of the first and third transistors are formed from a front side of the bulk.

According to an embodiment, the drain of the second transistor is coupled to the midpoint between the transistors in series of the first branch and the drain of the fourth transistor is coupled to the midpoint between the transistors in series of the second branch.

According to an embodiment, the sources of the second and fourth transistors are common.

According to an embodiment, the second and fourth transistors form the low-side transistors of the bridge, their sources being intended to be applied the lowest potential of a DC voltage applied to the bridge.

According to an embodiment, the second and fourth transistors are formed from a front side of the bulk.

According to an embodiment, the lateral transistors are formed in wells of a conductivity type opposite to that of the bulk.

An embodiment provides a DC current motor command system comprising a DC current motor and an H-bridge. One of the vertical transistors is turned on for an entire phase of rotation of the motor in one direction while the lateral transistor of the other branch is controlled in pulse width modulation to vary the rotation speed of the motor.

An embodiment provides a DC current motor command system comprising a DC current motor and an H-bridge. One of the lateral transistors is turned on all for an entire phase of rotation of the motor in one direction while the vertical transistor of the other branch is controlled in pulse width modulation to vary the rotation speed of the motor.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional, and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made, unless specified otherwise, to the orientation of the figures.

Unless specified otherwise, the expressions "around," "approximately," "substantially" and "in the order of" signify within 10%, and preferably within 5%.

Figure 1A:
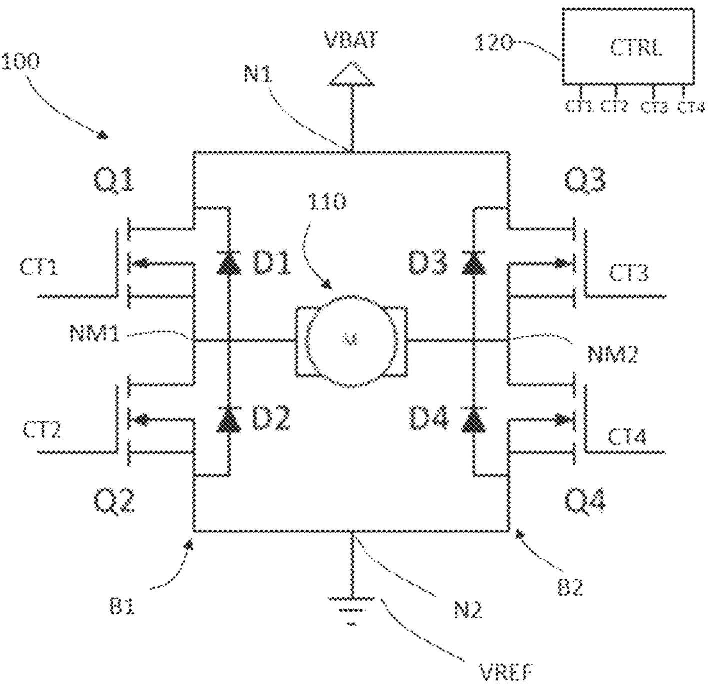
FIG. 1A schematically shows an embodiment of an H-bridge.

FIG. 1A schematically shows an embodiment of an H-bridge 100.

A command circuit with H-bridge switches comprises two parallel branches of switches in series, intended to be coupled by a load to form an "H" arrangement.

The H-bridge 100 of FIG. 1A comprises a first branch B1, comprising a first switch Q1 and a second switch Q2 in series, and a second branch B2 comprising a third switch Q3 and a fourth switch Q4 in series. Branches B1 and B2 are associated in parallel between a first node N1 and a second node N2 intended to receive a DC power supply voltage VBAT, referenced to a reference potential VREF, for example, the ground. The respective midpoints NM1 and NM2 of branches B1 and B2 define output terminals of the bridge, intended to be coupled to each other by a load 110 to be powered.

In the applications targeted by the present disclosure, load 110, for example, a motor, is a load requiring a current from a plurality of amperes to several tens of amperes, under a voltage capable of reaching several tens of volts. Switches Q1, Q2, Q3, and Q4 then are power switches, more precisely in the described embodiments, MOS power switches.

In the example of FIG. 1A, the switches are N-channel MOS, or NMOS, transistors. The transistors Q1 and Q3 on the high side, that is, on the side of terminal N1 intended to be applied the highest potential of the voltage applied between terminals or nodes N1 and N2, have their drains coupled, preferably connected, to terminal N1 and their sources coupled, preferably connected, respectively to nodes MN1 and MN2. The transistors Q2 and Q4 on the low side, that is, on the side of terminal N2 intended to be applied the lowest potential of the voltage applied between terminals N1 and N2, have their sources coupled, preferably connected, to terminal N2 and their drains coupled, preferably connected, respectively to nodes MN1 and MN2.

In the example of FIG. 1A, the bulks of the transistors are coupled, preferably connected, to the respective sources of the transistors. Further, intrinsic diodes D1, D2, D3, and D4 couple the respective sources of transistors Q1, Q2, Q3, and Q4 to their respective drains, with the anode on the source side.

The gates of transistors Q1, Q2, Q3, and Q4 are intended to receive command signals CT1, CT2, CT3, and CT4, delivered by a circuit 120 (CTRL).

To actuate a DC current motor, a high-side transistor Q1 or Q3 of a branch and a low-side transistor Q4 or Q2 of the other branch are activated, the selection between pair Q1-Q4 and pair Q3-Q2 conditioning the rotation direction of the motor. A braking of the motor is commanded by turning on the two transistors on a same side (low or high). The rotation speed of the motor may be adjusted by controlling the pulse width modulation (PWM) transistors, the duty cycle conditioning the rotation speed.

To maximize the efficiency of the H-bridge, it is useful for the transistors to have an on-state resistance (RON) as low as possible. It is possible to obtain this with vertical transistors, that is, transistors which have their source and their drain arranged on opposite surfaces of a semiconductor bulk.

Transistors with a lateral architecture, that is, with sources and drains arranged inside and on top of a same surface of a semiconductor bulk, enable high switching frequencies to be obtained, which enables an increase in the accuracy in terms of motor rotation speed. However, lateral transistors have an on-state resistance RON that is greater than that of vertical transistors and thus generate more losses under a given voltage. Their use is thus generally limited to low-power applications.

The described embodiments take advantage of the respective features of vertical and lateral transistors to form an H-bridge integrated in a same chip.

More particularly, it is provided to use vertical transistors to form the high-side transistors Q1 and Q3 and lateral transistors to form the low-side transistors Q2 and Q4.

The integration of two vertical NMOS transistors on a same chip is well suited to high-side transistors of the H-bridge since they then structurally have a common drain corresponding to the back side of the bulk. The integration of two lateral transistors is well suited to low-side transistors since their drains are conversely structurally dissociated and thus particularly adapted to respective connections across the motor.

Preferably, the switch command is performed to turn on the concerned high-side transistor during the entire phase of rotation in one direction while the low-side transistor with which it is associated is commanded in pulse-width modulation to vary the rotation speed. Thus, the high-side transistor, which is vertical, is not switched at high frequency and the low-side transistor, which is lateral, has discontinuous conduction periods, decreasing the impact of its high on-state resistance. It should be noted that the back side of the vertical transistors is then intended to receive the high potential of the power supply voltage while it usually is a plane intended to be connected to ground.

In another example, the switch command is performed to turn on the concerned low-side transistor for the entire phase of rotation in one direction while the high-side transistor with which it is associated is controlled in pulse width modulation to vary the rotation speed. In this case, a rapid command circuit may be used to control the high-side transistor.

Figure 1B:
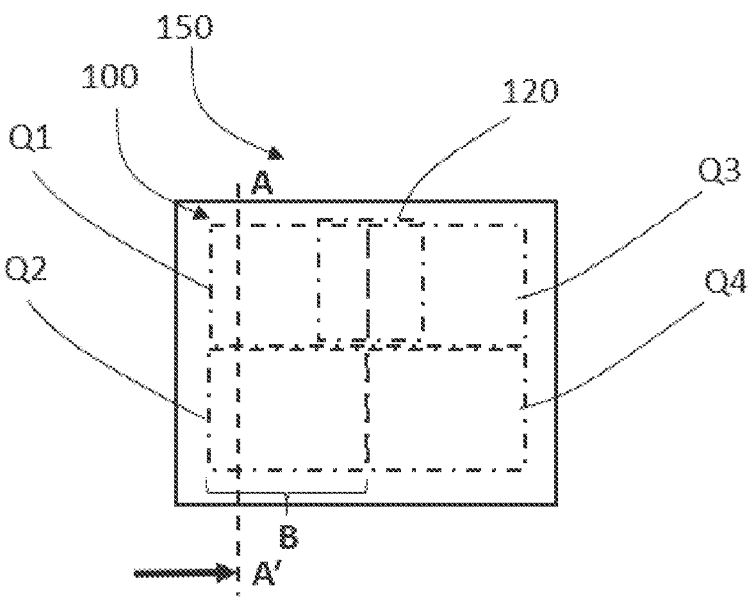
FIG. 1B schematically shows in top view an embodiment of an integrated circuit comprising an H-bridge according to an embodiment.

FIG. 1B very schematically shows in top view, an embodiment of an integrated circuit 150 comprising an H-bridge 100 according to an embodiment.

Figure 2:
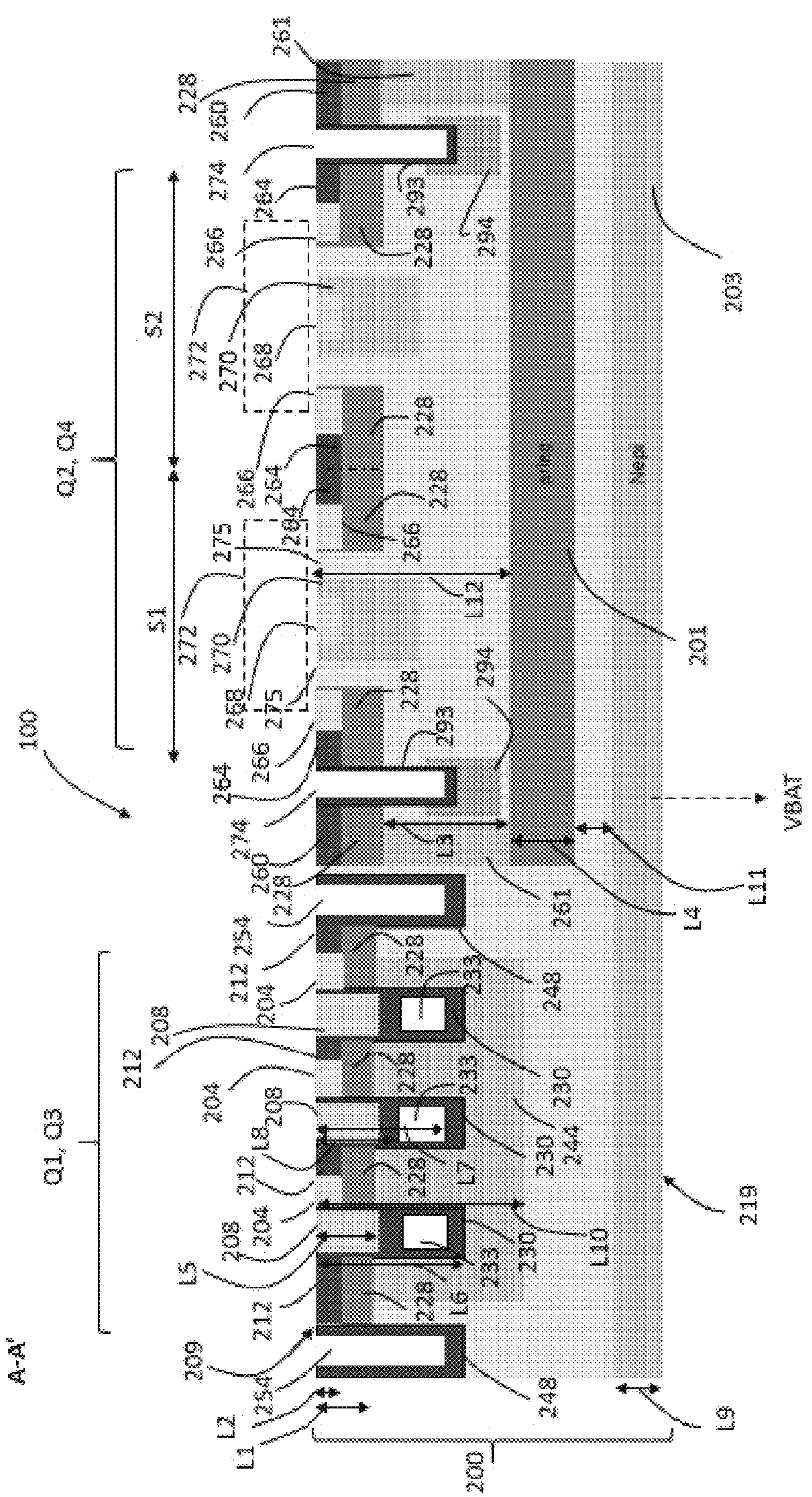
FIG. 2 is a cross-section view of the integrated circuit of FIG. 1B, along line A-A'.

FIG. 2 is a cross-section view of the integrated circuit of FIG. 1B, along line A-A'.

According to the described embodiments, the four MOS transistors of the H-bridge are spatially distributed in a same integrated circuit chip 150 of rectangular or square shape by arranging the two vertical transistors Q1 and Q3 on the same line and the two transistors Q2 and Q4 on the same line, the two branches B1 and B2 defining columns (in the orientation of this drawing). In these embodiments, circuit 120 is, for example, arranged between vertical transistors Q1 and Q3.

Cross-section A-A' crosses transistors Q1 and Q2. The same cross-section profile could be obtained with transistors Q3 and Q4. The four transistors are integrated inside and on top of a same bulk 200.

Figure 3:
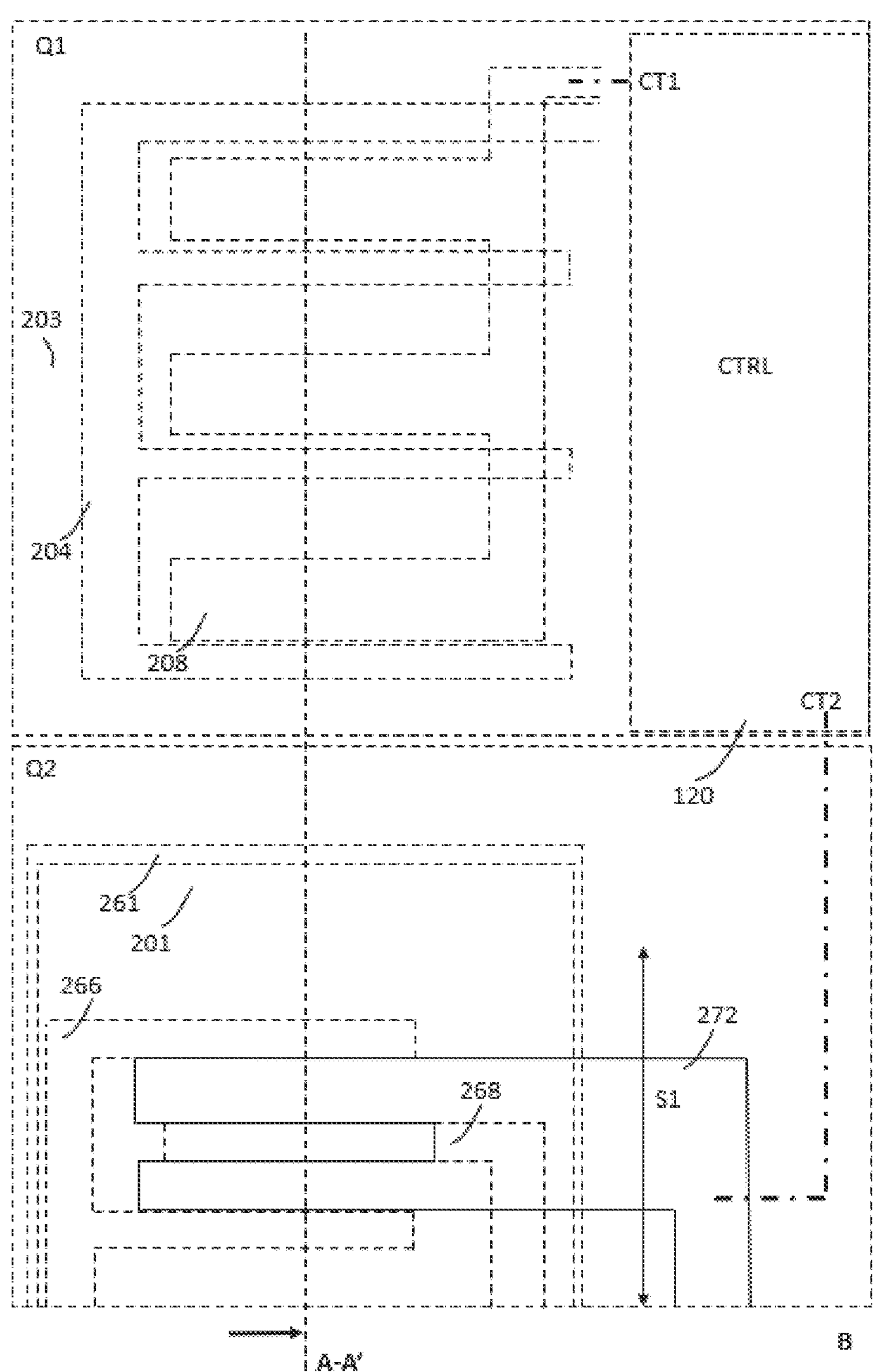
FIG. 3 is a partial top view of the integrated circuit of FIG. 1B.

For simplification, the description hereafter made in relation with FIGS. 2 and 3 discusses the respective structures of transistors Q1 and Q2, knowing that this description transposes to the structures of transistors Q3 and Q4. In the orientation of FIG. 2, transistor Q1 is in the left-hand portion while transistor Q2 is in the right-hand portion.

Bulk 200 is a semiconductor bulk, for example, made of silicon. Since bulk 200 integrates vertical NMOS transistors, it is of N type or N doped.

The drain of transistor Q1 is formed of a layer 203 (Nepi) formed by full-wafer epitaxy of the back side 219 of bulk 200. Due to its full-wafer character, layer 203 is common to vertical transistors Q1 and Q3.

The source and gate of transistor Q1 are formed from the front side 209 of bulk 200 in a region 244 having a higher doping level than the rest of the bulk. An advantage of this region 244 having a higher doping level N across the bulk thickness is that it takes part in decreasing the on-state resistance of the channel region which vertically forms between source and drain.

The gate of transistor Q1 is formed of a plurality of conductive gate portions 208, in insulating trenches etched in the bulk from the front side and extending in region 244 without crossing it. Each gate portion 208 is thus surrounded, in the bulk, with an insulator layer 230. In the shown example, three gate portions 208 are present. Their number may however be smaller or greater, for example, in the range from 1 to 10,000. Gate portions 208 are for example made of polysilicon.

The source of transistor Q1 is formed of a plurality of N-doped regions 204 with a doping level higher t than that of the bulk and of region 244, each region 204 being against a side of an insulating trench 230, in front of a gate portion 208. Each region 204 is separated from region 244 by a buried P-type region 228 forming the body or bulk of the transistor and reaching the front side 209 between gate portions 208 and source regions 204 with P overdoped regions 212.

In top view, regions 208, 204, and 212 form parallel strips, regions 208 being interconnected by one of their ends to form a conductive gate comb.

Preferably, each insulating trench 230 comprises, under each gate portion, and surrounded with the insulator of trench 230, a conductive region 233 (FP or field plate), intended to be biased to decrease the sensitivity of the gate to electric fields and improve the transistor breakdown voltage.

In the shown example, vertical transistor Q1 is surrounded with a peripheral trench 248 of electrostatic isolation from the other transistors. Trench 248 includes a conductive portion 254 extending from front side 209. Conductive portion 254 is connected to the ends (in the horizontal direction in top view of the chip) of regions 233 so as to bias them.

Lateral transistor Q2 (right-hand portion of FIG. 2) is formed in a P-type well to isolate it from the voltage applied on the back side 219 and laterally from the other transistors. The well is the assembly formed by P-doped trenches 261 defining the edges of the well and a layer 201 (pring), also P-doped, defining the bottom of the well. Layer 201 is buried in bulk 200 while being separated from layer 203.

Lateral transistor Q2 for example comprises two symmetrical structures S1, S2 arranged side by side. In the rest of the present disclosure, only structure S1 is described, structure S2 being deduced by symmetry.

The drain of each structure S1, S2, of transistor Q2 is formed of an overdoped N-type drain region 268, formed from the front side 209 of bulk 200 in a region 270 itself having a higher N doping level than the rest of the bulk.

The source of each structure S1, S2, of transistor Q2 is formed of two source regions surrounding the drain in the view of FIG. 2. Each region 266 is N doped with a doping level higher than that of the bulk. Each source region is formed in a P-type region 228 forming the body or bulk of the transistor and reaching front side 209, on the side of source regions 266 opposite to drain 268, with P overdoped regions 264. The source regions 266 of each structure S1, S2 closest to the other structure share a same region 228. Each source region 266 is separated from region 270 by a portion of the bulk.

Source regions 266 are for example configured to be connected together with conductive tracks in the form of a comb. The same applies for drain regions 268.

In the shown example, horizontal transistor Q2 is surrounded with a peripheral trench 293 (field plate) of electrostatic isolation from the other transistors. Trench 293 is an insulating trench filled with a conductive portion 274 from front surface 209. Conductive portions 274 are configured to be biased to decrease the sensitivity of transistor Q2 to the electric field and improve the transistor breakdown voltage.

N doped regions 294 with an N doping level higher than that of the bulk are arranged around the low portion of trenches 293. They enable to decrease the influence of the parasitic PMOS between the P surface doped portion 228, 264 and buried layer pring 201.

The implementation of the well allows the monolithic integration of vertical power transistors Q1, Q3 and of horizontal power transistors Q2, Q4 in a same bulk and close to each other while guaranteeing the possibility of modulating the voltages of drains of the lateral transistors independently for each lateral transistor.

The gate of transistor Q2 is for example formed of two conductive gate portions 272 (illustrated in dotted lines in FIG. 2), connected together and arranged above the front side 209 of the bulk to cover, with an interposed gate insulator, not shown, the areas between the drain regions 268 and the source regions 266. In another example, not illustrated, the gate of transistor Q2 is formed by gate regions in trenches 293 arranged similarly to the gate regions 208 of transistor Q1.

FIG. 3 is a partial top view of the integrated circuit of FIG. 1B. More particularly, FIG. 3 schematically shows in simplified fashion the area B of FIG. 1B, corresponding to transistor Q1, to a portion of circuit 120, and to the structure s1 of transistor Q2.

In the shown example, the gate regions 208 of transistor Q1 are formed in the form of a comb and connected together to a main track which is configured to receive signal CT1. Source regions 204 are also arranged in the form of a comb offset with respect to the comb of gate regions 208 by an insulator.

The source regions 266, the drain regions 268, and the gate regions 272 of transistor Q2 are arranged in the form of combs. The fingers of the comb of regions 266 vertically alternate (according to the orientation of FIG. 3) with the fingers of the comb of regions 268. The fingers of the comb of gate regions 272 are arranged between the fingers of the source and drain regions 268 but above the front side 209 of bulk 200.

The gate regions 272 of transistor Q2 are arranged to receive signal CT2.

In the shown example, the well formed by regions 261 and layer 201 surrounds from the outside the fingers of the combs of the source and drain regions.

Figure 4:
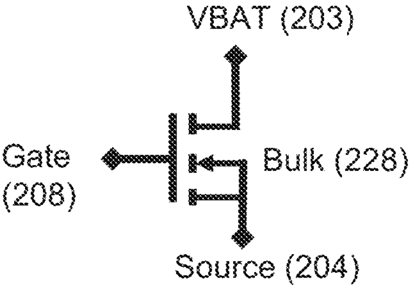
FIG. 4 is an equivalent electric diagram of a portion of the integrated circuit of FIG. 2.

FIG. 4 is an equivalent electric diagram of a portion of the integrated circuit of FIG. 2. More particularly, FIG. 4 shows in simplified fashion the equivalent electric diagram of a vertical transistor Q1 or Q3. As described in relation with FIG. 3, regions 208 form the gate, regions 204 form the source, drain 203 is formed at the back side 219 and is configured to be coupled, preferably connected, to voltage rail VBAT, and the bulk of the transistor is formed by regions 228.

Figure 5:
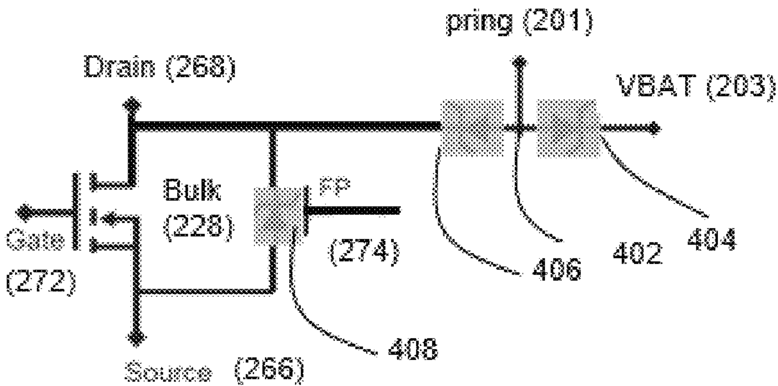
FIG. 5 is an equivalent electric diagram of another portion of the integrated circuit of FIG. 2.

FIG. 5 is an equivalent electric diagram of another portion of the integrated circuit of FIG. 2. More particularly, FIG. 5 shows in simplified form the equivalent electric diagram of a lateral transistor Q2 or Q4. As described in relation with FIG. 3, regions 266 form the source, regions 272 form the gate, and regions 268 form the drain.

From the electrical point of view, a vertical Zener diode 404 is formed by region 201, the bulk, and region 203 (at potential VBAT), the anode of the diode being formed of region 201 (pring). Another Zener diode 406 is formed by region 201, the bulk, and region 270, the anode of the diode being formed of region 201. The two diodes 404 and 406 are head-to-tail (common anode 402). The bulk of the transistor is formed by regions 228 which are in contact with the corresponding regions 266. Zener diodes 404 and 406 take part in the isolation between vertical transistors and lateral transistors. Another Zener diode 408 is formed between the bulk 228 of the transistor coupled to the source (region 266) and the drain (region 268), its anode being formed by region 228 and its avalanche voltage (Zener diode) being adjusted, via region 294, by the voltage applied to region 274 (FP). As a specific example of embodiment, the avalanche voltages of the Zener diodes are of a few tens of volts, for example, in the order of 40-45 volts.

Various embodiments and variants have been described. Those skilled in the art will understand that certain features of these various embodiments and variants may be combined, and other variants will occur to those skilled in the art. In particular, circuit 120 may be arranged between the two lateral transistors Q2 and Q4 or between the assembly of the vertical and lateral transistors.

Finally, the practical implementation of the described embodiments and variations is within the abilities of those skilled in the art based on the functional indications given hereinabove. In particular, when the H-bridge is used to power a three-phase motor, such as a DC current brushless motor, it is possible to adapt the described H-bridge by adding an additional branch, identical to branches B1 or B2, in parallel with the two branches B1, B2. The midpoint of the additional branch being configured to be coupled, preferably connected, to the third phase of the motor.

What is claimed is:

1. A DC current motor command system comprising:

a DC current motor; and an integrated monolithic H-bridge comprising:

a bulk semiconductor region;

a first branch comprising a first vertical MOS transistor and a second lateral MOS transistor integrated in the bulk semiconductor region, the first vertical MOS transistor and the second lateral MOS transistor being coupled in series; and a second branch comprising a third vertical MOS transistor and a fourth lateral MOS transistor integrated in the bulk semiconductor region, the third vertical MOS transistor and the fourth lateral MOS transistor being coupled in series and the first and second branches being coupled in parallel;

wherein the command system is designed so that the first vertical MOS transistor of the H-bridge is turned on for an entire phase of rotation of the motor in one direction while the fourth lateral MOS transistor is controlled in pulse width modulation to vary a rotation speed of the motor or the second lateral MOS transistor is turned on for the entire phase of rotation of the motor in the one direction while the third vertical MOS transistor is controlled in pulse width modulation to vary the rotation speed of the motor.

2. The system according to claim 1, wherein a midpoint of the first branch between the first vertical MOS transistor and the second lateral MOS transistor defines a first output terminal of the H-bridge and wherein a midpoint of the second branch between the third vertical MOS transistor and the fourth lateral MOS transistor defines a second output terminal of the H-bridge.

3. The system according to claim 1, wherein a source of the first vertical MOS transistor is coupled to a midpoint between the first vertical MOS transistor and the second lateral MOS transistor of the first branch and wherein a source of the third vertical MOS transistor is coupled to a midpoint between the third vertical MOS transistor and the fourth lateral MOS transistor of the second branch.

4. The system according to claim 1, wherein drains of the first vertical MOS transistor and the third vertical MOS transistor are electrically connected in common on a back side of the bulk semiconductor region.

5. The system according to claim 1, wherein the first vertical MOS transistor and the third vertical MOS transistor are high-side transistors of the H-bridge, the first vertical MOS transistor and the third vertical MOS transistor each having a drain intended to have applied thereto the highest potential of a DC voltage applied to the H-bridge.

6. The system according to claim 1, wherein the first vertical MOS transistor and the third vertical MOS transistor each have a gate and a source disposed at a front side of the bulk semiconductor region.

7. The system according to claim 1, wherein a drain of the second lateral MOS transistor is coupled to a midpoint between the first vertical MOS transistor and the second lateral MOS transistor of the first branch and wherein a drain of the fourth lateral MOS transistor is coupled to a midpoint between the third vertical MOS transistor and the fourth lateral MOS transistor of the second branch.

8. The system according to claim 1, wherein a source of the second lateral MOS transistor is coupled to a source of the fourth lateral MOS transistor.

9. The system according to claim 1, wherein the second lateral MOS transistor and the fourth lateral MOS transistor are low-side transistors of the H-bridge, sources of the second lateral MOS transistor and the fourth lateral MOS transistor being intended to have applied thereto the lowest potential of a DC voltage applied to the H-bridge.

10. The system according to claim 1, wherein the second lateral MOS transistor and the fourth lateral MOS transistor are formed at a front side of the bulk semiconductor region.

11. The system according to claim 1, wherein the second lateral MOS transistor and the fourth lateral MOS transistor are formed in wells of a conductivity type opposite to that of the bulk semiconductor region.

12. The system according to claim 1, wherein the command system is designed so that the first vertical MOS transistor of the H-bridge is turned on for an entire phase of rotation of the motor in one direction while the fourth lateral MOS transistor is controlled in pulse width modulation to vary a rotation speed of the motor.

13. The system according to claim 1, wherein the command system is designed so that the second lateral MOS transistor is turned on for an entire phase of rotation of the motor in one direction while the third vertical MOS transistor is controlled in pulse width modulation to vary a rotation speed of the motor.

14. An integrated monolithic H-bridge comprising:

a bulk semiconductor region having a front side and a back side;

a first vertical MOS transistor having current path extending from a first source/drain region at the front side of the bulk semiconductor region to a second source/drain region at the back side of the bulk semiconductor region;

a second lateral MOS transistor integrated in the bulk semiconductor region and having first and second source/drain regions disposed at the front side of the bulk semiconductor region, the first source/drain region of the second lateral MOS transistor connected to the first source/drain region of the first vertical MOS transistor;

a third vertical MOS transistor having a current path extending from a first source/drain region at the front side of the bulk semiconductor region to a second source/drain region at the back side of the bulk semiconductor region;

a fourth lateral MOS transistor integrated in the bulk semiconductor region and having first and second source/drain regions disposed at the front side of the bulk semiconductor region, the first source/drain region of the fourth lateral MOS transistor connected to the first source/drain region of the third vertical MOS transistor;

a high voltage node connected to the second source/drain of the first vertical MOS transistor and to the second source/drain of the third vertical MOS transistor; and a low voltage node connected to the second source/drain of the second lateral MOS transistor and to the second source/drain of the fourth lateral MOS transistor.

15. The H-bridge according to claim 14, further comprising:

a first output terminal connected to the first source/drain region of the second lateral MOS transistor and the first source/drain region of the first vertical MOS transistor; and a second output terminal connected to the first source/drain region of the fourth lateral MOS transistor and the first source/drain region of the third vertical MOS transistor.

16. The H-bridge according to claim 14, wherein the first vertical MOS transistor and the third vertical MOS transistor each have a gate disposed at the front side of the bulk semiconductor region.

17. The H-bridge according to claim 14, wherein the second lateral MOS transistor and the fourth lateral MOS transistor are formed in wells of a conductivity type opposite to that of the bulk semiconductor region.

18. A semiconductor structure comprising:

a bulk semiconductor region having a first conductivity type;

an epitaxial layer of a second conductivity type disposed at a back side of the bulk semiconductor region;

a first doped region of the first conductivity type extending from a front side of the bulk semiconductor region, the first doped region being more highly doped than the bulk semiconductor region;

a second doped region of the second conductivity type disposed within the first doped region at the front side of the bulk semiconductor region;

a first conductive region disposed at the front side of the bulk semiconductor region adjacent the second doped region, the first conductive region separated from the second doped region by an insulating layer;

a third doped region of the second conductivity type disposed within the bulk semiconductor region at the front side of the bulk semiconductor region, the third doped region being laterally spaced from the second doped region;

a fourth doped region of the second conductivity type disposed within the bulk semiconductor region at the front side of the bulk semiconductor region, the fourth third doped region being laterally spaced from the third doped region by a region of the first conductivity type;

a second conductive region overlying the region of the first conductivity type and electrically insulated therefrom; and a buried layer disposed within the bulk semiconductor region beneath the third doped region, the fourth doped region, and the region of the first conductivity type, the buried layer not extending beneath the second doped region.

19. The semiconductor structure according to claim 18, wherein:

the epitaxial layer comprises a drain of a vertical transistor;

the second doped region comprises a source of the vertical transistor;

the third doped region comprises a drain of a lateral transistor; and the fourth doped region comprises a source of the lateral transistor.

20. The semiconductor structure according to claim 19, further comprising:

a second vertical transistor disposed in the bulk semiconductor region and laterally spaced from the vertical transistor, the epitaxial layer comprises a drain of the second vertical transistor; and a second lateral transistor disposed in the bulk semiconductor region and laterally spaced from the lateral transistor.

* * * * *